(12) United States Patent
Berger et al.

(10) Patent No.: US 7,761,820 B2
(45) Date of Patent: *Jul. 20, 2010

(54) AUTOMATED MIGRATION OF ANALOG AND MIXED-SIGNAL VLSI DESIGN

(75) Inventors: Israel Berger, Haifa (IL); Kirill Dyagilev, Haifa (IL); Dov Ramm, D.N. Menashe (IL); Benjamin Sheinman, Haifa (IL); Oren Shlomo, Nesher (IL)

(73) Assignee: International Business Machines Corporation, Armonk, NY (US)

( * ) Notice: Subject to any disclaimer, the term of this patent is extended or adjusted under 35 U.S.C. 154(b) by 193 days.

This patent is subject to a terminal disclaimer.

(21) Appl. No.: 11/964,757

(22) Filed: Dec. 27, 2007
(Under 37 CFR 1.47)

(65) Prior Publication Data
US 2008/0109106 A1      May 8, 2008

Related U.S. Application Data

(63) Continuation of application No. 11/198,466, filed on Aug. 5, 2005, now Pat. No. 7,409,651.

(51) Int. Cl.
*G06F 17/50* (2006.01)
(52) U.S. Cl. .................. 716/3; 716/2; 716/4; 716/11
(58) Field of Classification Search .............. 716/2–4, 716/11
See application file for complete search history.

(56) References Cited

U.S. PATENT DOCUMENTS 6,453,445 B1 * 9/2002 Kuhn et al. .............. 716/3
2004/0143799 A1 * 7/2004 Hegde et al. .............. 716/3
2006/0101357 A1 * 5/2006 Allen et al. .............. 716/3

OTHER PUBLICATIONS

Savio et al., "Scaling Rules and Parameter Tuning Procedure for Analog Design Reuse in Technology Migration", May 2004, Proceedings of International Symposium on Circuits and Systems, vol. 5, pp. V-117-V-120.*

Dennard et al. in "Design of Ion-Implanted MOSFETs with Very Small Physical Dimensions," IEEE Journal of Solid-State Circuits, vol. SC-9, Oct. 1974, pp. 256-268.

(Continued)

*Primary Examiner*—Sun J Lin

(57) ABSTRACT

A method for migrating an electronic circuit from a source technology to a target technology includes accepting a source circuit that operates in the source technology. The source circuit includes source components interconnected at nodes in accordance with a source topology. Source voltages at the nodes of the source circuit are determined, and the source voltages are transformed to produce respective target voltages suitable for the target technology. The source circuit is separated into sub-circuits, each sub-circuit including one or more of the source components. In each sub-circuit individually, the one or more of the source components are converted to one or more respective target components in the target technology responsively to the target voltages, so as to produce a respective migrated sub-circuit. The migrated sub-circuits are reconnected to produce a target circuit in the target technology, the target circuit having a target topology identical to the source topology.

29 Claims, 6 Drawing Sheets

OTHER PUBLICATIONS

Galup-Montoro, et al., "Resizing Rules for MOS Analog-Design Reuse," IEEE Design and Test of Computers (19:2), Mar./Apr. 2002, pp. 50-58.

Hammouda et al., "A Fully Automated Approach for Analog Circuit Reuse," Proceedings of the Fourth IEEE International Workshop on System-on-Chip for Real-Time Applications, Banff, Canada, Jul. 2004.

Hammouda et al., "Analog IP Migration Using Design Knowledge Extraction," Proceedings of the 26th IEEE Custom Integrated Circuits Conference, San Jose, California, Sep. 2004, pp. 333-336.

Funaba et al., "A Fast and Accurate Method of Redesigning Analog Subcircuits for Technology Scaling," Analog Integrated Circuits and Signal Processing (25:3), Dec. 2000, pp. 299-307.

Virtuoso® NeoCircuit, produced by Cadence Design Systems, Inc. (San Jose, California). Additional details regarding this product can be found at http://www.cadence.com/products/custom_ic/neocircuit/index.aspx (link active as of Oct. 20, 2005).

Iskander, R. et al., "Synthesis of CMOS Analog Cells using AMIGO", Proceedings of theDesign, Automation and Test in Europe Conference and Exhibition '03, 1530-1591/03, IEEE.

Graeb, H. et al., "The Sizing Rules Method for Analog Integrated Circuit Design", 0-783-7247-6/01, 2001, IEEE.

Eckmuller, J. et al., "Hierarchical Characterization of Analog Integrated CMOS Circuits", Design, Automation and Test in Europe, 1998., Proceedings, Feb. 23-26, 1998, pp. 636-643.

* cited by examiner

AUTOMATED MIGRATION OF ANALOG AND MIXED-SIGNAL VLSI DESIGN

This application is a continuation application of U.S. patent application Ser. No. 11/198,466, filed Aug. 5, 2005, now U.S. Pat. No. 7,409,651.

FIELD OF THE INVENTION

The present invention relates generally to computer-assisted design (CAD) of very large scale integration (VLSI) devices, and particularly to methods and systems for automated migration of VLSI designs across technologies.

BACKGROUND OF THE INVENTION

As VLSI technology progresses, the characteristic feature size of VLSI devices continually decreases from one technology generation to the next. Smaller feature-size devices enable a designer to fit higher-complexity systems on chip (SoC) onto a smaller die area, to increase the operating frequency, as well as to reduce the operating voltages, power consumption and heat dissipation of the device. These advances in VLSI technology create a need for reusing circuit designs, proven and verified in one technology, in another technology. In some cases, migration of circuits from one technology to another is performed manually. Manual migration, however, is often a labor-intensive, tedious, slow and expensive process.

Several methods and systems are known in the art for automatic migration of digital circuitry from one technology to another. Typically, these methods use "optical scaling," in which the dimensions of components of the source circuit are geometrically scaled to fit the target technology feature size. Such automatic conversion methods are described, for example, by Dennard et al. in "Design of Ion-Implanted MOSFETs with Very Small Physical Dimensions," IEEE Journal of Solid-State Circuits, volume SC-9, October 1974, pages 256-268.

Optical scaling methods are often unsuitable for converting analog and mixed-signal (A&MS) circuits, such as clock generation circuitry, input/output (I/O) circuits, analog-to-digital and digital-to-analog converters (ADC, DAC). Several methods are known in the art for converting A&MS designs. For example, Galup-Montoro, et al., describe a conversion procedure that follows a set of resizing rules in "Resizing Rules for MOS Analog-Design Reuse," IEEE Design and Test of Computers (19:2), March/April 2002, pages 50-58.

Hammouda et al. describe a method for automatic circuit resizing between different technologies in "A Fully Automated Approach for Analog Circuit Reuse," Proceedings of the Fourth IEEE International Workshop on System-on-Chip for Real-Time Applications, Banff, Canada, July 2004. The method studies the original design, extracts its major features (basic device and block features, device matching, parasitics and symmetry) and reproduces a resized design in the target technology having the same performance as the original design. A similar method is described by the same authors in "Analog IP Migration Using Design Knowledge Extraction," Proceedings of the 26$^{th}$ IEEE Custom Integrated Circuits Conference, San Jose, Calif., September 2004, pages 333-336.

Some migration methods perform multivariate parameter optimization. For example, Funaba et al. describe an approach for technology scaling of metal-oxide semiconductor (MOS) analog circuits in "A Fast and Accurate Method of Redesigning Analog Subcircuits for Technology Scaling," Analog Integrated Circuits and Signal Processing (25:3), December 2000, pages 299-307. The authors describe a circuit optimization method based on matching equivalent circuit parameters between a previously designed circuit and the circuit undergoing redesign. Optimization methods are also used in a circuit sizing and optimization tool called Virtuoso® NeoCircuit, produced by Cadence Design Systems, Inc. (San Jose, Calif.). Additional details regarding this product can be found at www.cadence.com/products/custom_ic/neocircuit/index.aspx.

SUMMARY OF THE INVENTION

There is therefore provided, in accordance with an embodiment of the present invention, a method for migrating an electronic circuit from a source technology to a target technology. The method includes accepting a source circuit that operates in the source technology. The source circuit includes source components interconnected at nodes in accordance with a source topology. Source voltages at the nodes of the source circuit are determined, and the source voltages are transformed to produce respective target voltages suitable for the target technology. The source circuit is separated into sub-circuits, each sub-circuit including one or more of the source components. In each sub-circuit individually, the one or more of the source components are converted to one or more respective target components in the target technology responsively to the target voltages, so as to produce a respective migrated sub-circuit. The migrated sub-circuits are reconnected to produce a target circuit in the target technology, the target circuit having a target topology identical to the source topology.

In an embodiment, converting the one or more of the source components includes determining geometrical properties of the one or more of the source components responsively to the target voltages. Additionally or alternatively, converting the one or more of the source components includes identifying whether the one or more of the source components belong to a specialized component type including at least one of switching components, digital components and matched components, and applying a dedicated conversion process to the specialized component type.

In a disclosed embodiment, identifying whether the one or more of the source components belong to the specialized component type includes at least one of detecting an operational condition typical of switching components and accepting an indication from a designer identifying at least some of the matched components, the switching components and the digital components.

In another embodiment, applying the dedicated conversion process includes at least one of setting a bias operating point suitable for the switching components, and migrating a led component of the matched components responsively to a conversion of a leading component selected from the matched components.

In yet another embodiment, for some of the source voltages, transforming the source voltages includes iteratively searching for optimal values of the respective target voltages.

In still another embodiment, converting the one or more of the source components includes defining control parameters specifying performance-related constraints for converting the one or more of the source components, and determining geometrical properties of the respective one or more target components responsively to the control parameters.

In an embodiment, defining the control parameters includes defining scaling factors between electrical properties of the one or more of the source components and the one or more respective target components, the scaling factors including a voltage scaling factor, a current scaling factor and an additional control parameter. Typically, the additional control parameter includes one of a channel length scaling factor, an effective channel length scaling factor, an input capacitance scaling factor, an effective transconductance scaling factor and an output conductance scaling factor.

In another embodiment, determining the geometrical properties includes determining at least one of a geometrical length and a width of the one or more target components.

In yet another embodiment, after reconnecting the migrated sub-circuits, the method includes verifying a performance of the target circuit and improving the performance by modifying at least one of the control parameters of at least one source component and re-converting the at least one source component responsively to the modified at least one of the control parameters.

In still another embodiment, transforming the source voltages includes, for some of the source voltages, identifying an external voltage including at least one of a reference voltage, a threshold voltage and multiple supply voltages applied to the source circuit, determining perturbed voltages in the source circuit responsively to perturbed values of the external voltage, determining voltage sensitivity coefficients responsively to the perturbed values of the external voltages, and transforming the source voltages responsively to the sensitivity coefficients to produce respective target voltages in the target circuit.

In a disclosed embodiment, the method includes testing a topological structure of at least part of the source circuit to determine whether the topological structure is suitable for forming at least a respective part of the target circuit, by detecting a sub-threshold condition of a component in at least the respective part of the target circuit, the condition indicating unsuitability of the topological structure.

In an embodiment, the source circuit has a source performance figure-of-merit, and converting the one or more of the source components includes modifying the target circuit to have a corresponding target performance figure-of-merit, different from the source performance figure-of-merit.

In another embodiment, the method includes automatically replacing source technology schematic symbol representations of at least some the source components with respective target technology schematic symbol representations of at least some of the target components.

Apparatus and a computer software product for migrating an electronic circuit from a source technology to a target technology are also provided.

There is additionally provided, in accordance with another embodiment of the present invention, a method for migrating an electronic circuit from a source technology to a target technology. The method includes accepting a source circuit that operates in the source technology. The source circuit has a source performance figure-of-merit and includes source components interconnected at nodes in accordance with a source topology. At least some of the source components are converted to respective target components to produce a target circuit in the target technology, so that the target circuit has a target topology identical to the source topology and a corresponding target performance figure-of-merit different from the source performance figure-of-merit.

There is further provided, in accordance with yet another embodiment of the present invention, a method for migrating an electronic circuit from a source technology to a target technology. The method includes accepting a source circuit that operates in the source technology. The source circuit includes source components interconnected at nodes in accordance with a source topology. Source voltages at the nodes of the source circuit are determined, and the source voltages are transformed to produce respective target voltages suitable for the target technology. For each of at least some of the source components, one or more control parameters are defined, specifying performance-related constraints for conversion of the source component. The source components are converted to respective target components in the target technology responsively to the target voltages and the control parameters, so as to produce a target circuit in the target technology. The target circuit has a target topology identical to the source topology.

The present invention will be more fully understood from the following detailed description of the embodiments thereof, taken together with the drawings in which:

DETAILED DESCRIPTION OF EMBODIMENTS

Overview

Figure 1:
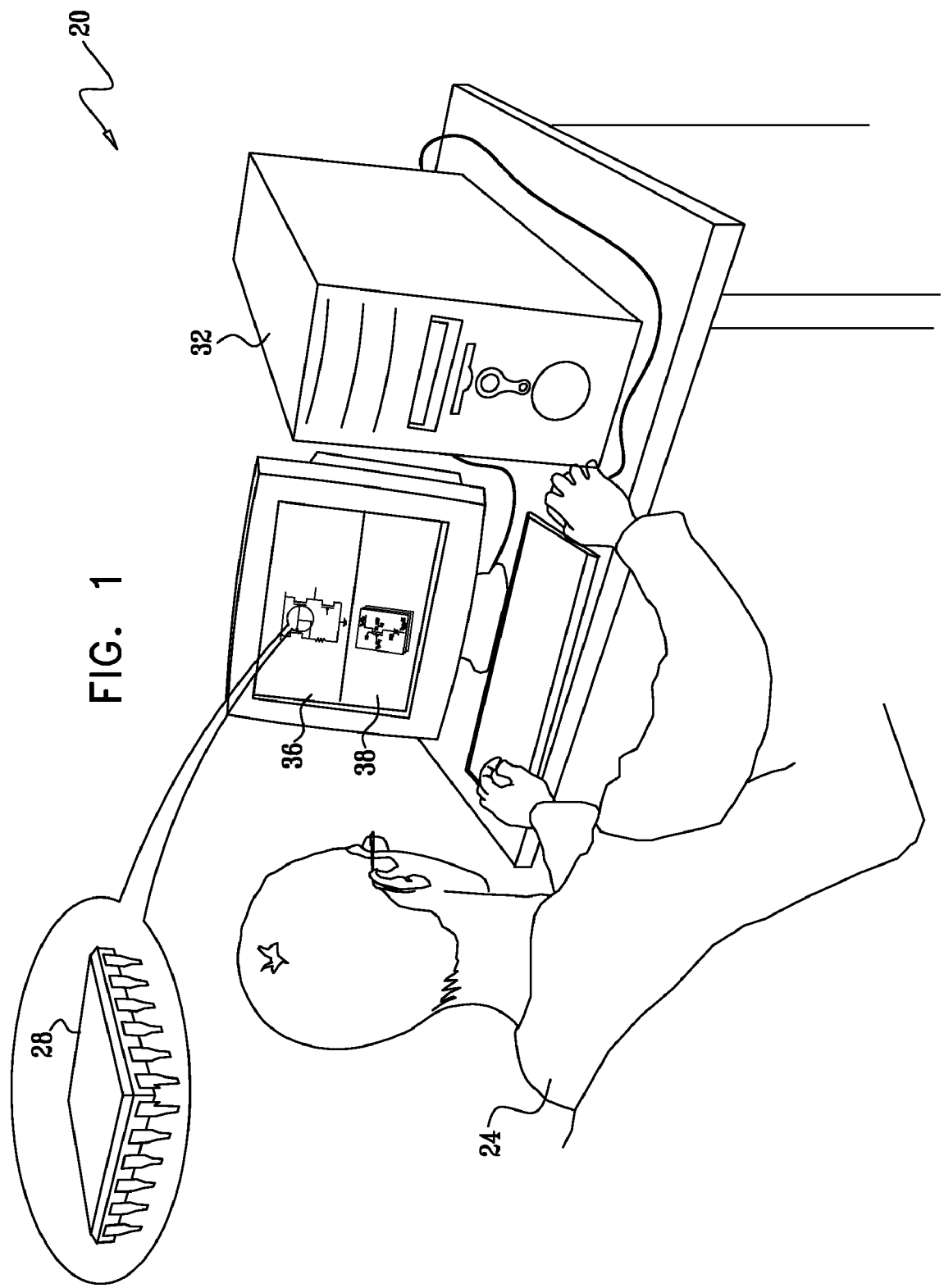
FIG. 1 is a schematic, pictorial illustration of a system for automated VLSI design migration, in accordance with an embodiment of the present invention.

Known methods for automatic migration of analog and mixed-signal (A&MS) circuits possess several inherent shortcomings. For example, methods based on component resizing rules, such as described in the paper by Galup-Montoro cited above, are generally suitable only for circuits and components biased by current sources. Furthermore, when converting transistors, such methods typically provide satisfactory results only for long-channel components, typically having channel lengths above 1 μm.

In some known automatic migration methods, defining the migrated circuit often requires computations or simulations of the entire circuit simultaneously in each iteration step. Such methods, and in particular methods based on multivariate optimization, thus require significant computational resources because of the large number of iteration steps involved. This shortcoming sometimes limits the maximum circuit size that can be migrated using these methods.

In view of these shortcomings of the prior art, embodiments of the present invention provide improved methods and systems for automated migration of A&MS circuits. In some embodiments, a migration processor converts a source circuit in a source technology to a target circuit in a target technology, while preserving the circuit topology. Each source component in the source circuit is replaced with a corresponding target component in the target circuit, in accordance with predefined component models and a cross-technology mapping definition.

The processor determines voltages and currents in the various nodes of the source circuit, for example using a direct current (DC) simulation. The processor transforms the voltages of the source circuit, typically by scaling the voltages, to produce respective target voltages suitable for the target technology. The processor then splits the source circuit into independent sub-circuits, each sub-circuit containing one or more of the source circuit components. Within each sub-circuit, the processor replaces source components with respective target components in the target technology. The processor calculates geometrical properties of the target components, such as transistor gate width and channel length, responsively to the target voltages. The processor then re-connects the sub-circuits to produce a target circuit in the target technology, which has the same topology as the source circuit.

Since the processing of each sub-circuit is performed individually, i.e., independently of other sub-circuits, the computational complexity of the disclosed methods is significantly reduced, allowing for the migration of larger circuits. Because the scaled target voltages are used as the biasing voltages of the sub-circuits, it is assured that the components perform in the same manner when re-connected to form the target circuit.

In some embodiments, the designer can specify one or more control parameters that affect the geometrical dimensioning, and hence the performance, of each target component. Such control parameters are typically expressed as scaling factors of certain electrical properties from the source technology to the target technology. Control parameters may comprise, for example, scaling factors of the component voltage, current, channel length, input capacitance, transconductance and output conductance.

In some embodiments, after the source circuit has been converted into a target circuit, the designer can simulate the target circuit and verify that its performance is satisfactory. If the performance of a particular component is not satisfactory, the designer can modify the control parameters affecting the migration of this component. The migration processor then performs additional iterations of the migration process, until satisfactory performance is achieved. In other embodiments, the entire migration process may be performed automatically.

In many cases, because of the use of designer-specified control parameters, the first migration iteration already provides a functional target circuit. Subsequent performance-related corrections are typically minor and local.

In some embodiments, the migration processor identifies, either automatically or using designer input, components belonging to specialized component types. Each specialized component type, such as switching components, matched components and digital components may be migrated using a different process.

The basic voltage scaling method is further generalized to calculate the appropriate scaling factors and voltages in situations in which external voltages are applied to the source circuit. External voltages comprise, for example, multiple supply voltages and biasing reference voltages. Threshold voltages may also be considered as external voltages. The generalized "extended voltage scaling" method is described hereinbelow.

Another disclosed method tests the circuit topology in order to detect conditions in which it is not possible to achieve a functional target circuit using the topology of the source circuit. When such a condition is detected, the migration processor alerts the designer to the fact that a manual topology modification is desired.

Since the disclosed methods and systems use explicit component models for performing the migration, the migration performance is not limited to long-channel technologies. The inventors have tested the method on various long- and short-channel components, down to 0.06 µm, with good performance.

The disclosed methods and systems are further arranged to smoothly integrate with conventional VLSI design processes and tools, requiring minimal human intervention.

System Description

FIG. 1 is a schematic, pictorial illustration of a system 20 for automated VLSI design migration, in accordance with an embodiment of the present invention. A designer 24 designs a VLSI device 28 using a design tool 32. Device 28 is to be designed and fabricated in a certain technology, referred to as a "target technology." In some embodiments, at least part of the circuitry of device 28, referred to as a "source circuit" 36, has already been designed and tested in a different technology, referred to as a "source technology." The target and source technologies are often referred to by their characteristic feature size, such as 0.18, 0.13 or 0.06 µm technologies. Design tool 32 re-uses source circuit 36 and converts it, using methods which will be explained in detail below, into a target circuit 38. Target circuit 38 is then typically integrated as part of the design of device 28. Design tool 32 thus performs automated migration of source circuit 36 designed in the source technology to target circuit 38 in the target technology.

In some embodiments, design tool 32 performs automated migration from a source technology having a certain feature size to a more advanced target technology having a smaller feature size, such as conversion from 0.25 µm to 0.13 µm or from 0.18 µm to 0.06 µm. In other embodiments, tool 32 may be used when the fabrication process of device 28 is modified, within the same technology feature size. In these embodiments, source circuit 36 is designed to fit the previous fabrication process and target circuit 38 is designed to fit the modified process. Process modifications may comprise, for example, component model replacements, omission or deletion of certain component models, or restrictions on the inclusion of certain components in certain designs. For example, the source circuit may comprise a certain circuit component that is too expensive or otherwise undesired in the design of the target circuit. Tool 32 and the migration methods described below can be used to produce target circuit 38 that does not contain the undesired component. In still other embodiments, tool 32 may migrate the source circuit from a certain source technology to target technology having a larger feature size, for example for reducing production costs. All of these conversion processes are collectively referred to herein as circuit migration from a source technology to a target technology.

Figure 2:
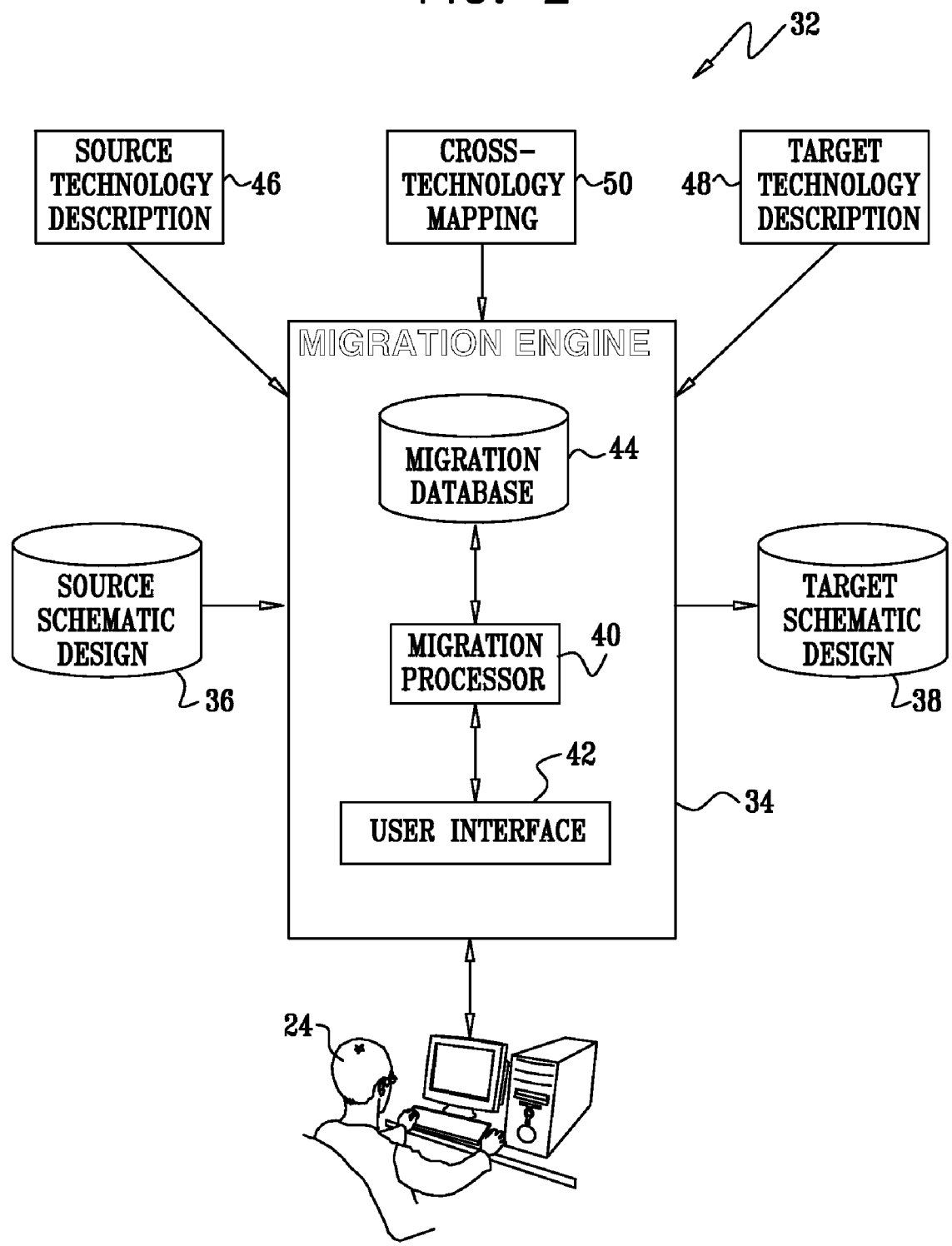
FIG. 2 is a block diagram that schematically illustrates details of a VLSI design tool, in accordance with an embodiment of the present invention.

FIG. 2 is a block diagram that schematically illustrates details of design tool 32, in accordance with an embodiment of the present invention. Tool 32 comprises a migration engine 34 comprising a migration processor 40 that implements the automated circuit migration methods described hereinbelow. The migration engine interacts with designer 24 using a suitable user interface 42.

In some embodiments, source circuit 36 is provided to the migration engine by the designer via an input interface comprising user interface 42. In other embodiments, the input interface comprises a machine-to-machine interface. In these embodiments, the source circuit is provided to the migration engine automatically from another computer or from another application on the same computer, such as from a suitable design-capture application in design tool 32.

In some embodiments, source circuit 36 comprises a visual schematic diagram in addition to the machine-readable circuit definitions. In these embodiments, processor 40 converts the visual schematic diagram to a corresponding visual schematic diagram of target circuit 38. Such conversion of the visual schematic design enables the designer to have better visibility and control over the migration process.

Processor 40 uses a migration database 44 in migration engine 34 for storing component parameters in the source and target technologies and other migration-related information. Database 44 typically comprises a record per each component in the source circuit and in the target circuit.

In addition to migration engine 34, design tool 32 may comprise additional VLSI circuit design, simulation and testing functions such as, for example, direct-current (DC) simulation, layout functions, corner analysis and statistical simulation tools for assessing process variations. In some embodiments, migration engine 34 can be integrated as part of a conventional VLSI design tool. An exemplary design tool that can be used for this purpose is Virtuoso® Schematic Composer, produced by Cadence Design Systems. Details regarding this product can be found at www.cadence.com/products/custom_ic.

Typically, migration processor 40 comprises a general-purpose computer, which is programmed in software to carry out the functions described herein. The software may be downloaded to the computer in electronic form, over a network, for example, or it may alternatively be supplied to the computer on tangible media, such as CD-ROM. Further alternatively, processor 40 may be implemented using a combination of hardware and software elements. The migration processor may be a standalone unit, or it may alternatively be integrated with other components of design tool 32.

In order to perform the migration process, migration engine 34 accepts a source technology description 46 and a target technology description 48. Source technology description 46, typically provided to engine 34 as a data file, comprises a list of component types used in source circuit 36. The component types may comprise various types of transistors, resistors, capacitors, diodes, transmission lines, etc. For each component type, the list comprises a reference to a model of this component type in the source technology. The component models match the characteristics of the source technology and its corresponding fabrication process, and are often provided by the fab or device manufacturer of the source technology. In some embodiments, component models are represented in a standard format, such as BSIM models, SPICE models or behavioral models, as are known in the art. Target technology description 48 comprises a similar list of component types and references to component models, as used in the target technology.

Migration engine 34 also accepts a cross-technology mapping 50. Mapping 50, typically provided as a data file, defines a mapping between source technology component types (that appear in description 46) and corresponding target technology component types (that appear in description 48). In some embodiments, the cross-technology mapping uniquely maps a target technology component type to each source technology component type. Alternatively, a particular source technology component type may be mapped to two or more alternative target technology component types. The actual selection of a target component in target circuit 38, out of the alternative component types, may depend on circuit parameters and/or designer preference. In some cases two or more source technology component types are mapped to a single target technology component type.

In some embodiments, mapping 50 also comprises pin mapping between the pin assignments of the source and target technology component types. In cases in which a source technology component type has a different number of pins from its corresponding target technology component type, the mapping also comprises information regarding the desired pin arrangement—e.g., indication of pins that should be connected to other pins, to ground or to power supply nets.

Typically, cross-technology mapping 50 is produced in advance by the designer, considering the component characteristics in the source and target technologies. In some embodiments, descriptions 46 and 48 and mapping 50 are common to all migrations from a given source technology to a given target technology. Additionally or alternatively, some or all of these definitions can be updated or modified per each circuit migration.

Migration Method Description

Figure 3:
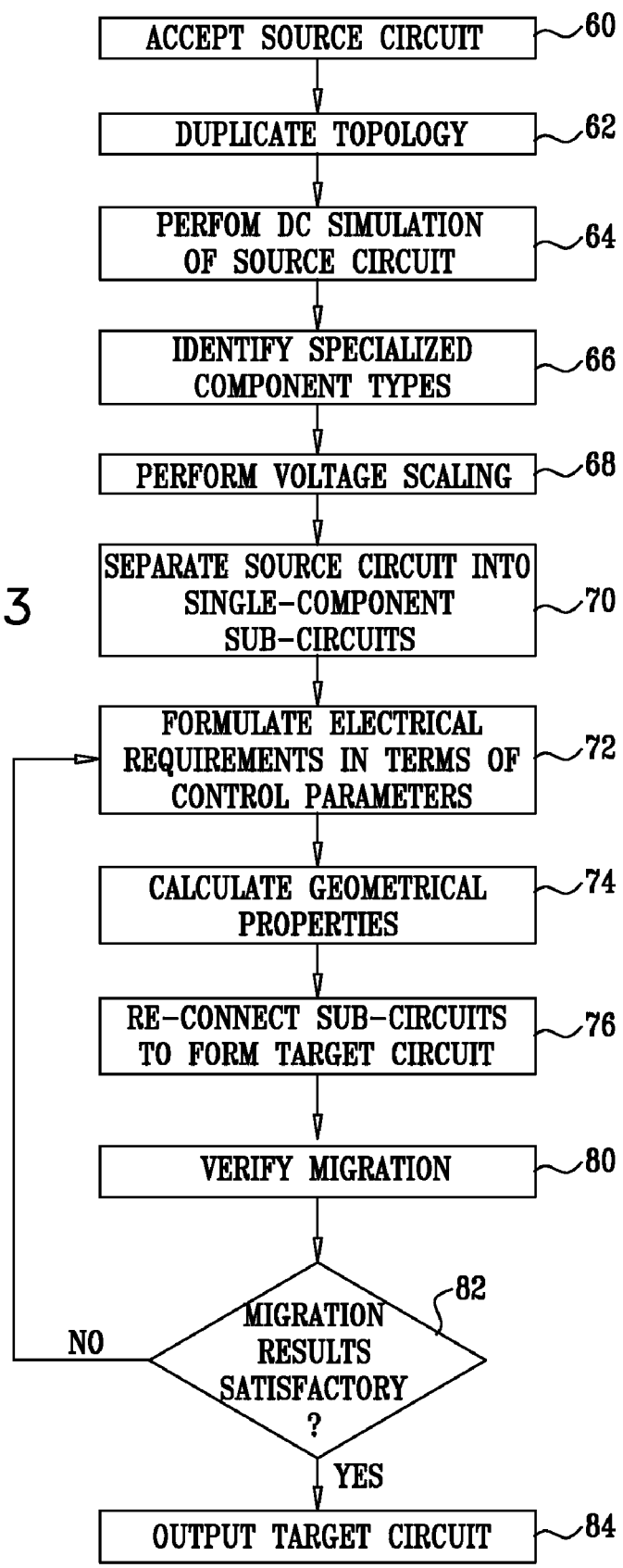
FIG. 3 is a flow chart that schematically illustrates a method for automated VLSI design migration, in accordance with an embodiment of the present invention.

FIG. 3 is a flow chart that schematically illustrates a method for automated VLSI design migration, in accordance with an embodiment of the present invention. An example demonstrating the migration process of an actual circuit is shown in FIGS. 4A-4G below.

The method begins with migration engine 34 accepting a source schematic design of source circuit 36, at a circuit input step 60. The schematic design comprises all source circuit components and the interconnections between them and is usually provided as a collection of data files. The circuit nodes are sometimes referred to as nets. (The terms "net" and "node" are used interchangeably.) Source circuit 36 comprises components, such as transistors, diodes, capacitors, resistors and transmission lines. Source circuit 36 is to be migrated so as to provide a functional circuit in the target technology.

Processor 40 duplicates the topology of source circuit 36 to serve as the topology of target circuit 38, at a duplication step 62. For each source technology component in source circuit 36, migration processor 40 identifies a corresponding target technology component, in accordance with cross-technology mapping 50.

With the exception of several specialized component types discussed below, processor 40 uses a process called "basic voltage scaling" for calculating the voltages at the nodes of target circuit 38. In basic voltage scaling, the voltages at the nodes of source circuit 36, including the supply voltage, are scaled using a voltage scaling factor denoted $k_v$ to produce the voltages at the respective nodes in the target circuit. In many cases, the scaling factor corresponds to the ratio between the supply voltages of the source and target circuits. For example, consider a source circuit in 0.25 μm technology operating at 2.5V that is migrated to a 0.12 μm technology target circuit operating at 1.2V. Typically, all voltages will be scaled by a factor of $k_v$=2.5V/1.2V≈2.1. Alternatively, a different supply voltage and/or a different scaling factor can be defined by the designer. In some embodiments, the ratio between supply voltages is used as the default voltage scaling factor. Source voltages are scaled using this factor, unless a different scaling factor is specified by the designer or by one of the automated methods described herein.

In order to determine the original node voltages, currents and small signal parameters of source circuit 36, design tool 32 first performs a DC simulation of circuit 36, at a source simulation step 64. The DC simulation may be performed using any suitable simulation means. In some embodiments, when engine 34 is part of a conventional VLSI design tool, the DC simulation that is part of the conventional design tool can be used for this purpose. The DC simulation produces the DC voltages and currents at each node of circuit 36. In some embodiments, an additional output of the DC simulation is a set of small signal parameters calculated for each of the source circuit components, based on the component models. The DC voltages, currents and small signal parameters, which define the operating conditions of circuit 36 in the source technology, are provided to migration processor 40. In some embodiments, the voltages, currents and small signal parameters of each component in source circuit 36 are stored in a corresponding record in migration database 44.

In some embodiments, migration processor 40 applies different migration methods to certain specialized component types, in order to improve their functionality and performance in the target circuit. Such component types comprise, for example, transistors that operate as switching components (e.g. logic gates, switches and inverters) and matched components. Although processor 40 may apply basic voltage scaling to these component types, it is often preferable to treat them separately, sometimes with the assistance of the designer. A detailed description of a method for migration of these component types is given below.

Migration processor 40 identifies components that belong to specialized component types, at a type classification step 66. In some embodiments, processor 40 examines the components of source circuit 36 and the results of the DC simulation and automatically identifies components that belong to specialized component types. In these embodiments, processor 40 may apply predefined classification criteria for performing the automatic classification. Alternatively, the designer can indicate components belonging to the specialized component types to processor 40. Further alternatively, some components may be classified automatically, while others may be classified with designer assistance.

One exemplary specialized component type comprises switching components. Similarly to digital components, switching components typically operate over a load-line that runs from cut-off through a linear range up to saturation. However, in many cases it is desirable to have some control over the performance of the migrated switching component. Known optical scaling methods used for migrating digital components typically do not enable such control.

In some embodiments, processor 40 uses the results of the DC simulation to automatically identify electrical operating conditions typical of switching components, so as to identify switching components in source circuit 36. For example, processor 40 can identify a switching transistor by detecting an operating point typical of switching transistors, such as a high gate-to-source voltage ($V_{gs}$) and/or a high drain-to-source voltage ($V_{ds}$). In other embodiments, if the DC current flowing through a component is smaller than a predefined threshold, the component may also be classified by processor 40 as a switching component. Alternatively, switching components may be indicated to processor 40 by the designer.

The bias voltages of switching components are set by processor 40 or manually by the designer so as to make sure the target technology component operates at an operating point suitable for switching components. In some embodiments, the designer selects a suitable characteristic operating point of a certain switching component in source circuit 36. Using a DC simulation of the source circuit, as will be described below, the bias voltages and small-signal parameters of the switching component in source circuit 36 are determined at the chosen operating point. The designer then sets appropriate control parameters of the migration process, so as to cause the migrated target technology switching component to operate at an operating point similar to the operating point of the corresponding source technology component. Definitions of control parameters and their effect on the migration process are described in detail below. When source circuit 36 comprises several switching components, the use of control parameters can assure that ratios and relationships between operating points of different switching components are preserved in the migration process.

In some cases, voltage scaling does not produce satisfactory results for certain components. Therefore, the designer may choose to calculate the biasing voltages of these components using an iterative process. In this process, the designer specifies a voltage range for every chosen net over which iterations should be performed. For each voltage in the range, the entire component migration process (as described in steps 72-80 below) is carried out for the specific component. The designer evaluates a performance figure-of-merit of the migrated component at each bias voltage level and determines which of the voltages produces the best performance. Alternatively, the voltage corresponding to the best performance may be determined automatically by migration processor 40 in an iterative process. This voltage is then used in the target circuit.

In some cases, source circuit 36 comprises matched components. Matched components are components that are intentionally constrained to have the same geometry or to preserve a certain geometry relation between them. For example, two or more transistors can be defined as having the same channel length but may have different channel widths.

An exemplary scenario in which components can be represented as matched components is the migration of a differential transistor pair, wherein both transistors should be converted to target technology transistors having the same geometries. Another example is a current mirror, in which the current produced by a current source is scaled by two or more transistors whose relative dimensions determine the current scaling. Yet another example is the migration of dummy components, i.e., inactive components added to the schematic design of source circuit 36 for layout purposes. Such dummy components should typically be migrated to target technology components having dimensions that are similar to those of a certain active component.

In some embodiments, the designer identifies to processor 40 which components in source circuit 36 are matched components. The designer can mark one of the matched components as a "leading" component and mark other matched components as being "led" by this component. The leading component itself is converted by processor 40 using voltage scaling. The migration processor subsequently calculates the geometry of the led components in the target circuit based on the geometry of the leading component, while preserving the geometry relations between the led and leading components in the source circuit. In other embodiments, matching components are automatically detected by processor 40. In some embodiments, the designer may define any number of groups of leading and led matched components.

In some embodiments, migration processor 40 also differentiates between digital components and analog and mixed-signal (A&MS) components. In some embodiments, the differentiation is performed automatically by processor 40. Alternatively, the designer can indicate the digital and A&MS components to processor 40. Digital components are scaled using any suitable method known in the art, such as optical scaling. A&MS components are migrated using the methods described herein. The classification of each component as being an A&MS or a digital component, or a component belonging to one of the specialized component types, is typically indicated in the corresponding component record in migration database 44.

In some embodiments, processor 40 marks the components classified as belonging to specialized component types on the schematic design of source circuit 36 and displays the marked components to the designer for verification. The designer can approve or modify the automatic classification. The designer can also modify the classification criteria used by processor 40.

For those A&MS components not identified as belonging to a specialized component type, processor 40 performs basic voltage scaling using a scaling factor $k_v$ equal to the ratio between the supply voltages of the source and target circuit, at a voltage scaling step 68. In some embodiments, processor 40 performs a process called "extended voltage scaling" for some source circuit voltages at step 68. The criteria for choosing when to use each of the voltage scaling processes, as well as a method for performing extended voltage scaling, are detailed in the description of FIG. 5 below. The scaled voltages used to bias each target circuit component are stored in the corresponding record in database 44.

The migration processor now splits source circuit 36 into sub-circuits, at a separation step 70. Typically, each sub-circuit comprises a single component such as a transistor. Alternatively, any other suitable separation of source circuit 36 into sub-circuits comprising one or more components can be used. The biasing voltages in each sub-circuit are the scaled voltages taken from the corresponding nodes of target circuit 38. This process is also referred to as "voltage distribution." From this stage, processor 40 analyzes and converts each sub-circuit to the target technology individually, independent from the other sub-circuits.

Unlike some known migration techniques that perform migration at the entire circuit level, embodiments of the present invention significantly reduce the computational complexity of the migration process. The complexity is reduced by the separation of the source circuit into smaller, independent sub-circuits that require a considerably smaller number of iteration steps to converge. By using the scaled voltages as constraints in the conversion of each sub-circuit, it is assured that once all sub-circuits are converted and re-connected to one another, the behavior of each component in the target circuit will be the same as its behavior in the isolated sub-circuit.

Migration processor 40 continues the migration process by converting each source technology component to a corresponding target technology component. In some embodiments, converting each component comprises selecting a suitable target technology component from description 48 and setting certain geometrical properties of the selected target technology component. Processor 40 thus determines geometrical properties of each component in each sub-circuit. In order to calculate the geometry of each component, the designer can choose to define certain electrical properties that he or she considers important, at a parameter definition step 72. Migration processor 40 then uses the electrical properties as control parameters, or constraints, to determine the geometry of the target technology component, at a geometry estimation step 74. The control parameters chosen by the designer are also stored in database 44.

Control parameters are often represented as scaling factors of the relevant electrical property from the source technology to the target technology, indicating which feature of the component in question should be constrained in the migration process. The following examples describe several control parameters that affect the geometry and performance of a field-effect transistor (FET). Alternatively, any other suitable electrical property can be used, depending on the component type and target technology. (Many of the examples given herein address the migration of FETs. However, the disclosed methods are suitable, mutatis mutandis, for migrating any other type of components, such as diodes. The disclosed methods can also be used to migrate passive components such as resistors, capacitors, on-chip transmission line components and resistance-capacitance (RC) wire models. The adaptations required for migrating these types of components will be apparent to those skilled in the art after reading the description that follows.)

Consider a FET in source circuit 36 that is being migrated to a corresponding FET in target circuit 38. Typically, two fundamental control parameters, namely a voltage scaling factor and a source-drain current scaling factor, are first specified. By default, the voltage scaling factor denoted $k_v$ is typically defined as $k_v = V_{dd}^{(s)}/V_{dd}^{(t)}$, wherein $V_{dd}^{(s)}$ and $V_{dd}^{(t)}$ denote the supply voltages of the source and target circuits, respectively. In some embodiments, the designer can specifically define a different voltage scaling factor for a particular component or group of components. The source-drain current scaling factor denoted $k_I$ is defined as $k_I = I_d^{(s)}/I_d^{(t)}$, wherein $I_d^{(s)}$ denotes the drain current of the FET in source circuit 36 and $I_d^{(t)}$ denotes the corresponding drain current in the FET of target circuit 38.

After having scaled the voltage and current of the FET, there typically remains a single degree of freedom, which enables the designer to specify one additional performance-related control parameter. In some embodiments, the designer specifies a control parameter comprising one of the following: a geometrical channel length scaling factor denoted $k_L$, an effective channel length scaling factor denoted $k_{Leff}$, an input capacitance scaling factor denoted $k_c$ and an output conductance scaling factor denoted $k_{go}$. Alternatively, any other suitable scaling factor of a property of the component in question can be used. Based on the control parameters, processor 40 calculates the geometrical properties of the target technology FET.

The effective channel length scaling factor $k_{Leff}$ is defined as $k_{Leff} = L_{eff}^{(s)}/L_{eff}^{(t)}$, wherein $L_{eff}^{(s)}$ denotes the effective channel length of the FET in source circuit 36 and $L_{eff}^{(t)}$ denotes the effective channel length of the corresponding transistor in target circuit 38. The effective channel length is typically smaller than the geometrical length of the FET gate, denoted L. We can write $L_{eff} = L - \Delta L$, wherein $\Delta L$ is usually constant for a given technology. Thus, the geometrical gate length of the target technology FET can be written as:

$$L^{(t)} = \frac{L^{(s)} - \Delta L^{(s)}}{k_{Leff}} + \Delta L^{(t)} \quad [1]$$

wherein $\Delta L^{(s)}$, $\Delta L^{(t)}$ are constant per the given source and target technologies.

In some embodiments, the designer defines $k_I$ and $k_L$ (or $k_{Leff}$) subject to the following guidelines:

Circuit branches that are connected in series should be assigned similar current scaling factors, since they conduct the same current in both source and target technologies.

The channel length scaling factor should not be larger than the ratio of the minimal allowable channel lengths in the source and the target technologies. In other words, if a channel of a certain FET has a length larger than the minimal allowable length in the source technology, then the channel length of the corresponding target technology FET should also be larger than the minimal channel length allowed in the target technology.

Additionally or alternatively, the designer may determine control parameters $k_I$ and $k_L$ (or $k_{Leff}$) based on circuit performance considerations. For example, larger values of $k_I$ typically cause lower current in the target circuit, thereby reducing its power consumption. On the other hand, choosing $k_I$ too large (i.e., over-reducing the current) may degrade other performance figures of merit, such as the gain-bandwidth product of the FET. As another example, larger $k_L$ values typically reduce the area of the target technology FET and of the entire layout of target circuit 38. Thus, the designer should determine a reasonable trade-off when defining the control parameters.

Using the control parameters, processor 40 calculates the gate width and geometrical channel length of the target technology FET. The following example shows the calculation of the FET gate width when the channel length scaling factor was specified as a control parameter. For this purpose, processor 40 uses the appropriate FET model given in target technology description 48. In particular, the FET model expresses the drain-to-source current $I_d$ as a function of the gate voltage $V_{gs}$ and the drain voltage $V_{ds}$. In many FET models, the relation linking $I_d$ with $V_{gs}$ and $V_{ds}$ is approximately proportional to $W/L_{eff}$, wherein W denotes the gate width of the FET and $L_{eff}$ denotes the FET effective channel length. Since Id is determined by the current scaling factor, $V_{gs}$ and $V_{ds}$ are determined using voltage scaling, and $L_{eff}$ is determined as described above, W can be approximated using the FET model.

In some embodiments, the first approximation of W can be improved by iteratively substituting W estimates back into the FET model. In many cases, several iterations, typically between two and six, are sufficient for calculating the value of W. The convergence of W estimation is often faster for long channel FETs than for short channel FETs. The inventor's experience shows that even for a minimum geometrical channel length of 90 nm, six iterations are usually sufficient.

At this stage, migration processor 40 has converted all sub-circuits of source circuit 36. For each target technology component in the sub-circuits, processor 40 has estimated the geometrical properties of the component. Processor 40 stores the estimated geometrical properties in database 44.

Processor 40 now re-connects the sub-circuits to form target circuit 38, at a re-connection step 76. The re-connected target circuit has the same topology as source circuit 36 and comprises the voltages, currents and geometrical properties calculated at steps 68-74 above.

In some embodiments, the designer examines and verifies the performance of target circuit 38, at a migration verification step 80. For this purpose, the designer can perform any suitable simulation or verification procedure including, for example, DC simulation, alternating-current (AC) simulation and transient simulation. Some or all of these verification procedures may be an integral part of design tool 32. In many cases, a DC simulation of target circuit 38 is superfluous, since it is already provided by the DC simulation of the sub-circuits in the target technology, performed during the conversion process.

As part of verification step 80, the designer can examine target circuit 38 as a whole and/or the performance of specific components or sub-circuits. The designer can use user interface 42 to query migration database 44 for different parameters of source circuit 36 and target circuit 38, electrical and geometrical properties of components, control parameters, small-signal parameters of components, voltages, currents, etc. in order to verify the performance of target circuit 38.

If the designer decides that the performance of target circuit 38 is satisfactory, at a success checking step 82, migration engine 34 outputs target circuit 38, at an output step 84, and the migration process terminates. From this stage, the design, layout, verification and fabrication process of VLSI device 28 can continue as is conventionally known in the art.

If, on the other hand, the designer decides that the performance of target circuit 38 is not satisfactory, the method returns to parameter definition step 72. The designer modifies some of the control parameters so as to improve the performance of target circuit 38 in the next iteration. Processor 40 then performs another iteration of the migration process using the modified control parameters. In many cases, processor 40 needs to re-convert only a small part of the sub-circuits affected by the modification and not the entire circuit. This feature is another benefit of the independence between sub-circuits, achieved through voltage distribution.

In some embodiments, the entire migration process may be performed automatically by migration engine 32 without human intervention. In these embodiments, migration verification step 80 and success checking step 82 are implemented automatically, for example using predefined verification steps and success criteria.

In some embodiments, processor 40 also performs an automatic schematic symbol replacement procedure after generating the target circuit. In some cases, the schematic symbol representation and the pin arrangement of some components may take different forms in the source and target circuits. These differences can occur, for example, when the source and target circuits use design kits and/or models from different vendors. In such cases, processor 40 can automatically introduce the desired symbol representation in the schematic design of target circuit 38, perform the necessary re-routing to account for changes in pin arrangement, and update the target circuit accordingly.

The order of the method steps shown in FIG. 3 can be changed in different embodiments. For example, the replacement of source technology components with respective target technology components, described as part of duplication step 62 above, can also be performed after the source circuit has been separated into sub-circuits. As another example, voltage scaling can be performed either before or after the source circuit is separated into sub-circuits, or be performed on the source circuit, immediately following the source DC simulation.

In some embodiments, when using the method of FIG. 3, the designer can modify a performance figure-of-merit or a functionality of target circuit 38 to be different from the performance of source circuit 36. For example, let source circuit 36 be a voltage-controlled oscillator (VCO), designed in the source technology to produce an output signal within a certain frequency range. When migrating this VCO circuit to the target technology, the designer can choose to change the circuit parameters (such as by changing component control parameters) so that target circuit 38 is a VCO having a different frequency range. This feature of the disclosed methods and systems is in contrast to some prior art migration methods, which aim to maintain the same circuit performance.

Migration Process Example

FIGS. 4A-4G are circuit diagrams that schematically illustrate exemplary migration steps of the method of FIG. 3, in accordance with an embodiment of the present invention.

Figure 4A:
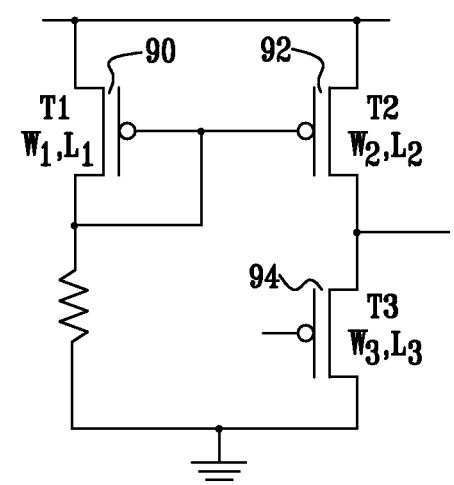
FIGS. 4A-4G are circuit diagrams that schematically illustrate migration steps in a method for automated VLSI design migration, in accordance with an embodiment of the present invention.

FIG. 4A shows an exemplary source circuit 36 as accepted in accordance with circuit input step 60 of the method of FIG. 3. In this example, source circuit 36 comprises three FETs 90, 92 and 94 denoted T1, T2 and T3, respectively. The gate widths $W_1$, $W_2$ and $W_3$ of the three FETs and their channel lengths $L_1$, $L_2$ and $L_3$ are typically chosen in source circuit 36 so as to meet the performance requirements set for circuit 36.

Figure 4B:
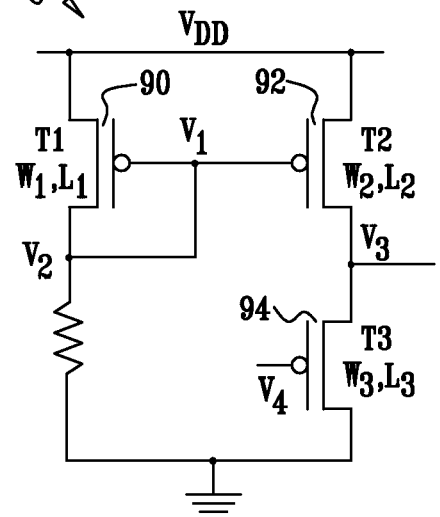

FIG. 4B shows source circuit 36 after performing a DC simulation, in accordance with source simulation step 64 of the method of FIG. 3. Supply voltage $V_{DD}$ and four node voltages denoted $V_1$, $V_2$, $V_3$ and $V_4$ are calculated by the DC simulation.

Figure 4C:
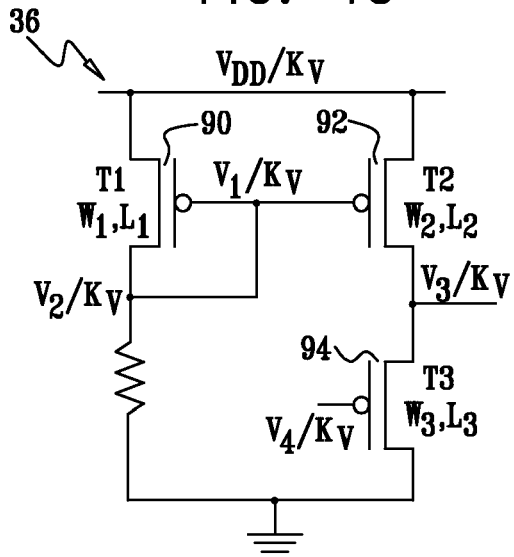

FIG. 4C shows source circuit 36 with all voltages scaled by a scaling factor $k_V$, in accordance with voltage scaling step 68 of the method of FIG. 3.

Figure 4D:
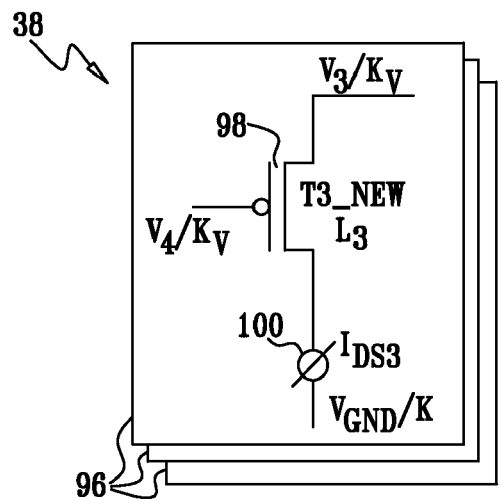

FIG. 4D shows the corresponding target circuit 38. Circuit 38 is divided into three sub-circuits 96, in accordance with separation step 70 of the method of FIG. 3. In this example, each of the three sub-circuits comprises a single FET. Each source technology FET is replaced by a respective target technology FET using cross-technology mapping 50, in accordance with duplication step 62 of the method of FIG. 3. For example, FET 94 is replaced in the target circuit by a FET 98 denoted T3_NEW. The drain-to-source current $I_{DS3}$ of FET 98 is provided by a current source 100.

Figure 4E:
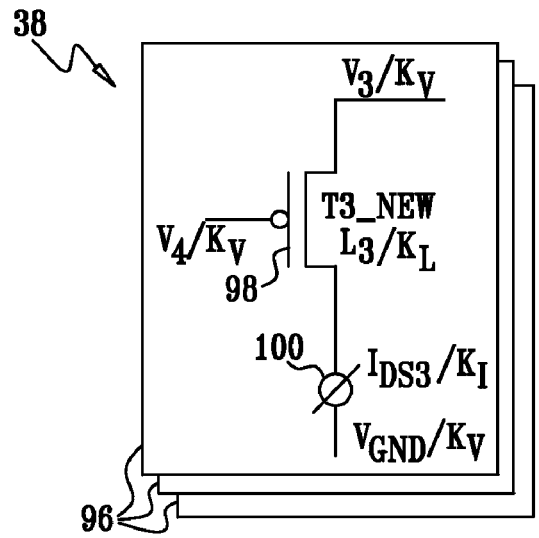

FIG. 4E shows sub-circuits 96 of target circuit 38 after the designer defines the appropriate control parameters, in accordance with parameter definition step 72 of the method of FIG. 3. In this example, source circuit 36 comprises two parallel branches, wherein the right hand side branch is DC-connected to other circuitry (not shown). The DC gate currents of the three FETs are assumed negligible. Therefore, the circuit has three independent currents, namely the drain-to-source currents of the three FETs. The designer thus has the freedom to choose up to three independent current scaling factors for these three currents, noting that the scaling of drain-to-source currents of FETs T2_NEW and T3_NEW should be similar. Additionally, the designer can choose up to three different channel length scaling factors for the three FETs. FIG. 4E shows the currents and channel lengths scaled by the chosen scaling factors, in accordance with parameter definition step 72 of the method of FIG. 3.

Figure 4F:
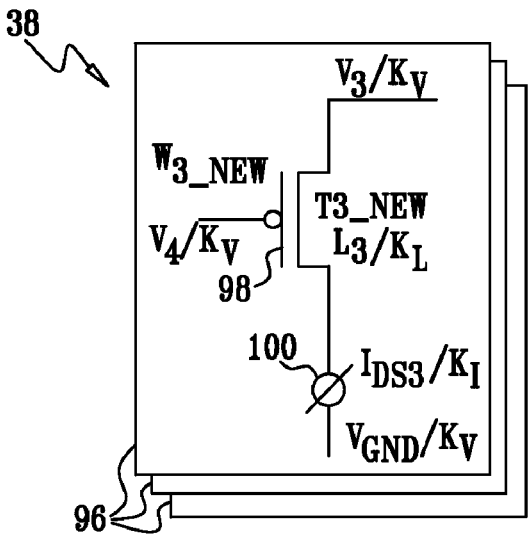

FIG. 4F shows sub-circuits 96 after the gate widths $W_{1\_NEW}, \ldots, W_{3\_NEW}$ are calculated, in accordance with geometry estimation step 74 of the method of FIG. 3.

Figure 4G:
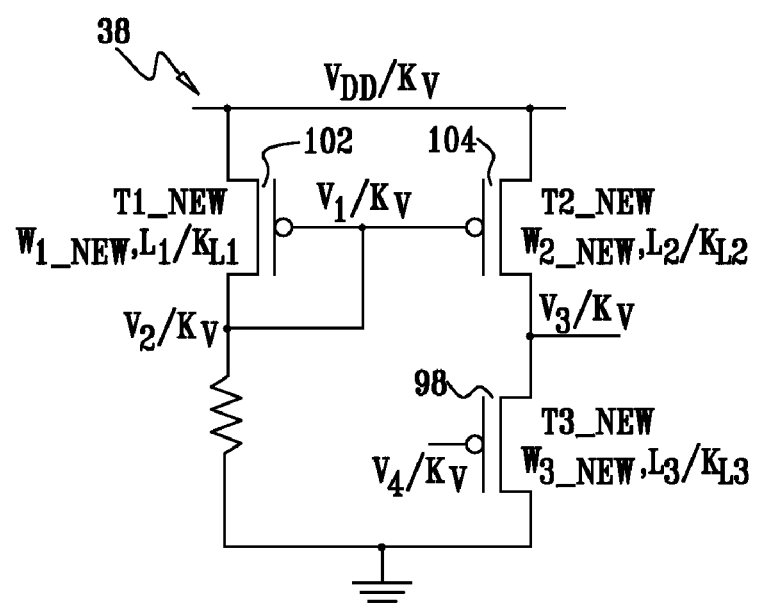

Finally, FIG. 4G shows target circuit 38 after the three sub-circuits are re-connected, in accordance with re-connection step 76 of the method of FIG. 3. The target circuit has the same topology as source circuit 36 of FIG. 4A, and comprises three target technology FETs with newly-calculated voltages, currents, channel lengths and gate widths.

Extended Voltage Scaling

In some cases, source circuit 36 comprises a single supply voltage and no additional external voltages. In these cases, migration processor 40 uses the basic voltage scaling method described above and scales all voltages using a single scaling factor $k_v$, which is equal to the ratio between the supply voltages of the source and target circuits. In other cases, however, source circuit 36 comprises additional voltages that should be scaled using scaling factors different from this ratio.

In some embodiments, a threshold voltage denoted $V_{th}^{(s)}$ may be defined for a certain transistor or diode in source circuit 36. The threshold voltage is typically specified as part of the component model in description 46. The corresponding target technology component has a threshold voltage denoted $V_{th}^{(t)}$ defined in its model. In some cases, the ratio between $V_{th}^{(s)}$ and $V_{th}^{(t)}$ is significantly different from the ratio between supply voltages. If the biasing voltages of this component were to be scaled according to the ratio between supply voltages, the operation of the target technology component could differ significantly from its expected behavior, since the biasing conditions of its gate would be significantly different from the biasing conditions in the source circuit.

In particular, when migrating from a source technology having a large feature size to a more advanced target technology having a small feature size, the ratio between supply voltages takes large values. Consequently, basic voltage scaling produces significantly lower voltages in the target circuit. Threshold voltages, on the other hand, often remain approximately the same in the source and target technologies. In such cases, scaling of threshold voltages by the ratio of supply voltages would cause the target technology component to operate at deep sub-threshold conditions.

In order to properly maintain the operation of components that are biased with threshold voltages, the designer can characterize these components to processor 40 by defining voltage scaling factor $k_v$ for these components as the ratio between the two threshold voltages: $k_v = V_{th}^{(s)}/V_{th}^{(t)}$. The values of $V_{th}^{(s)}$ and $V_{th}^{(t)}$ are derived from technology descriptions 46 and 48, respectively. In some cases, this voltage scaling factor may differ significantly from the ratio of supply voltages.

In some cases, a particular component in the source circuit may be biased using a fixed reference voltage. Scaling this reference voltage by the ratio of supply voltages does not necessarily produce a reference voltage that correctly biases the corresponding target technology component. In other cases, the source circuit may comprise more than a single supply voltage. A single voltage scaling factor $k_v$ is not generally suitable for scaling all supply voltages.

In some embodiments, migration processor 40 uses a process referred to herein as "extended voltage scaling" for determining the voltage scaling of external voltages. In the context of this patent application and in the claims, the term "external voltage" is used to describe any voltage that is externally specified and not derived from a potential difference in the circuit. Specifically, reference voltages, threshold voltages and multiple supply voltages are all examples of external voltages.

Figure 5:
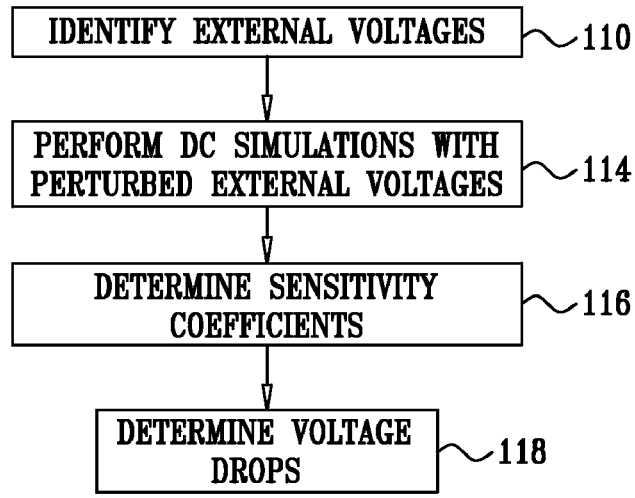
FIG. 5 is a flow chart that schematically illustrates a method for extended voltage scaling, in accordance with an embodiment of the present invention.

FIG. 5 is a flow chart that schematically illustrates a method for extended voltage scaling, in accordance with an embodiment of the present invention. In some embodiments, this method is used as part of voltage scaling step 68 of the method of FIG. 3 above when the source circuit comprises two or more differently scaled external voltages. For the sake of simplicity, the following description considers a source circuit having two groups of external voltages, denoted V and U, which should be scaled using two different scaling factors α and α', respectively. Generalization of the method to circuits having any number of external voltage groups is described further below.

Before describing the method steps of the extended voltage scaling method, the following description outlines the derivation of the basic equations used. Typically, DC simulations that are part of VLSI design tools use the well-known Kirchoff laws to formulate equations that describe the current-voltage relationships of each circuit component. Using the Kirchoff voltage law, n independent loops are marked in target circuit 38. The Kirchoff-law equations can be written as:

$$\sum_j u_{ij} = \sum_j V_{ij} + \sum_j U_{ij} \qquad [2]$$

wherein i denotes a loop index, i=1, ..., n. Index j denotes a branch index within each loop, and $u_{ij}$ denotes the internal voltage drop along the j-th branch of the i-th loop. $V_{ij}$ and $U_{ij}$ denote the external voltages across the j-th branch of the i-th loop that belong to the first and second groups, respectively. The external voltages scale according to the relations $V_{ij}^{(t)} = V_{ij}^{(s)}/\alpha$ and $U_{ij}^{(t)} = U_{ij}^{(s)}/\alpha'$.

Following this notation, the j-th branch of the i-th loop has an internal voltage drop $u_{ij}$ and two external voltages $V_{ij}$ and $U_{ij}$ applied across it. Typically, for most pairs of indices i, j, some of these voltages or even all of them are zero.

In addition to the Kirchoff equations, DC simulations of VLSI design tools typically construct a set of component equations that define the relations between the voltages and currents of each component in the source circuit. As part of the DC simulation, the design tool solves the combined set of all Kirchoff equations (including equations defining the current balance at each net) and the component equations to provide a nominal solution to $u_{ij}$.

In the case of two external voltage groups, the method described below applies small perturbations to voltages $U_{ij}$, so that $U_{ij} \rightarrow (1+\epsilon)U_{ij}$. Kirchoff equations [2] can now be re-written as:

$$\sum_j u_{ij}^{(\epsilon)} = \sum_j V_{ij} + (1+\epsilon)\sum_j U_{ij} \qquad [3]$$

wherein $u_{ij}^{(\epsilon)}$ denotes the voltage drop values given the perturbed external voltages. Since $\epsilon$ is assumed small, the derivative of $u_{ij}^{(\epsilon)}$ with respect to $\epsilon$ can be written as:

$$\left.\frac{du_{ij}^{(\epsilon)}}{d\epsilon}\right|_{\epsilon=0} = \frac{u_{ij}^{(\epsilon)} - u_{ij}}{\epsilon} \qquad [4]$$

The derivative defined by equation [4] can be interpreted as a sensitivity coefficient defining the variation in voltage drop across the j-th branch of the i-th loop, responsively to the perturbed external voltages of group U. Typical values of $\epsilon$ are on the order of 0.01, although any other suitable value can be used.

Substituting the scaling factors, we can re-write equation [2] for the target circuit as:

$$\sum_j u_{ij}^{(t)} = \sum_j V_{ij}^{(t)} + \sum U_{ij}^{(t)} \qquad [5]$$

$$= \frac{1}{\alpha}\sum V_{ij} + \frac{1}{\alpha'}\sum U_{ij}$$

$$= \frac{1}{\alpha}\sum (V_{ij} + U_{ij}) + \left(\frac{1}{\alpha'} - \frac{1}{\alpha}\right)\sum U_{ij}$$

Substituting $u_{ij}^{(t)} = \hat{u}_{ij}/\alpha$ we get:

$$\sum_j \hat{u}_{ij} = \sum (V_{ij} + U_{ij}) + \left(\frac{\alpha}{\alpha'} - 1\right)\sum U_{ij} \qquad [6]$$

Assuming $\alpha/\alpha' \approx 1$, we can substitute $\epsilon = \alpha/\alpha' - 1$ into equation [4]. Comparing the re-written equation [4] with equation [3] yields:

$$\hat{u}_{ij} = u_{ij} + (\alpha/\alpha' - 1)\frac{du_{ij}}{d\epsilon} \qquad [7]$$

and finally:

$$u_{ij}^{(t)} = \frac{u_{ij}}{\alpha} + \left(\frac{1}{\alpha'} - \frac{1}{\alpha}\right)\frac{du_{ij}}{d\epsilon} \qquad [8]$$

Thus, using equation [8] above, the voltage drops $u_{ij}^{(t)}$ in the target circuit can be calculated given the voltage drops in the source circuit and the sensitivity coefficients.

The derivation given above can be naturally extended to the case of N groups of external voltages, each group having a different scaling factor. The external voltages in the source circuit belonging to the k-th group, k=1 ... N, are denoted $^k V_{ij}^{(s)}$, wherein the left superscript k denotes the group index. These voltages are scaled using N scaling factors denoted $\alpha_k$ so that $^k V_{ij}^{(t)} = {}^k V_{ij}^{(s)}/\alpha_k$. Let $\alpha_1$ denote the scaling factor for one of the external voltages, such as the supply voltage $V_{dd}$. In the case of N voltage groups, the perturbed DC simulation is performed N−1 times, calculating N−1 sensitivity coefficients for each of the N−1 voltage groups. Voltages $^k V_{ij}^{(s)}$ are perturbed by substituting $^k V_{ij}^{(s)} \rightarrow {}^k V_{ij}^{(s)} \cdot (1+\epsilon)$ for k=2 ... N. Having performed the N−1 DC simulations, N−1 groups of sensitivity coefficients are calculated using:

$$\left.\frac{d^k u_{ij}^{(\epsilon)}}{d\epsilon}\right|_{\epsilon=0} = \frac{{}^k u_{ij}^{(\epsilon)} - u_{ij}}{\epsilon} \qquad [9]$$

wherein $^k u_{ij}^{(\epsilon)}$ denotes the sensitivity coefficient for the j-th branch of the i-th loop in the k-th simulation run (with respect to a variation of the external voltages of group k). Performing a similar calculation as in the case of two voltage scaling groups, the voltage drops in the target circuit are given by:

$$u_{ij}^{(t)} = u_{ij}/\alpha_1 + \sum_{k=2}^{N}\left(\frac{1}{\alpha_k} - \frac{1}{\alpha_1}\right)\left.\frac{d^k u_{ij}^{(\epsilon)}}{d\epsilon}\right|_{\epsilon=0} \qquad [10]$$

It can be seen that when all $\alpha_k$ scaling factors are equal ($\alpha_1 = \alpha_2 = ... = \alpha_N$), the right-hand term in equation [10] disappears, and equation [10] is reduced to the basic voltage scaling condition ($u_{ij}^{(t)} = u_{ij}/\alpha$).

The method of FIG. 5 begins with migration processor 40 identifying the external voltage groups, at an identification step 110. The external voltages can be indicated by the designer or identified automatically by processor 40. Typically, the first external voltage group comprises the external voltages that are scaled using the ratio of supply voltages $k_v = V_{dd}^{(s)}/V_{dd}^{(t)}$.

Processor 40 performs DC simulations, at a perturbed simulation step 114. As explained above, the number of DC simulations performed by processor 40 is equal to the number of identified external voltage groups. The first DC simulation is performed for the nominal, unperturbed values of the external voltages. An additional simulation is performed per each group of external voltages, with the external voltages of this group increased (for $\epsilon>0$, or decreased for $\epsilon<0$) by a small factor of $\epsilon$.

Using the results of the DC simulations, migration processor 40 calculates the effect of the small perturbations in the values of the external voltages on the solution of $u_{ij}$. Processor 40 calculates derivatives of $u_{ij}$ with respect to $\epsilon$, also referred to as sensitivity coefficients, at a sensitivity coefficient calculation step 116. In cases in which there are two groups of differently-scaling external voltages (N=2), the calculation is performed in accordance with equation [4] above. In cases in which N>2, the calculation follows equation [9] above.

Finally, processor 40 calculates the voltage drops at each circuit branch, at a voltage calculation step 118. In cases in which N=2, the calculation is performed in accordance with equation [8] above. In cases in which N>2, the calculation follows equation [10] above.

In cases in which some of the external voltages comprise threshold voltages, the computation of sensitivity coefficients for component threshold voltages should take into account the fact that threshold voltages do not directly appear as forcing terms in the Kirchoff voltage equations. Rather, the threshold voltages are specified in the component model of the relevant source technology component, and should be perturbed there by processor 40 before running the corresponding DC simulation.

Alternatively, threshold voltages can be accounted for by representing each gate-to-source voltage $V_{gs}$ as a sum of two terms: $V_{gs}=V_{th}+V_o$. Voltage $V_o$, referred to as an overdrive voltage, measures the excess voltage that biases the gate beyond the threshold voltage $V_{th}$. When writing the Kirchoff equations, only $V_{th}$ is treated as an external voltage rather than $V_{gs}$.

Topology Testing

The automated migration methods described above duplicate the topology of the source circuit and use it as the topology of the target circuit. In some cases, however, it is not possible to achieve the desired target circuit performance, or even a functioning target circuit, without making some topology modifications.

For example, in embodiments in which the ratio between supply voltages is significant (such as when migrating from a source technology having a certain supply voltage to a more advanced target technology having a smaller supply voltage), some transistor threshold voltages may scale with scaling factors much smaller than the ratio between supply voltages. In other words, these threshold voltages remain almost unscaled in the target circuit. In such cases, there is sometimes insufficient operational range for gate voltages in the target circuit to provide the desirable operating conditions. When this occurs, the small threshold voltage forces the transistor into a deep sub-threshold region, in which it is typically cut-off. In such cases, a workable circuit can only be achieved by manually changing the target circuit topology.

Figure 6:
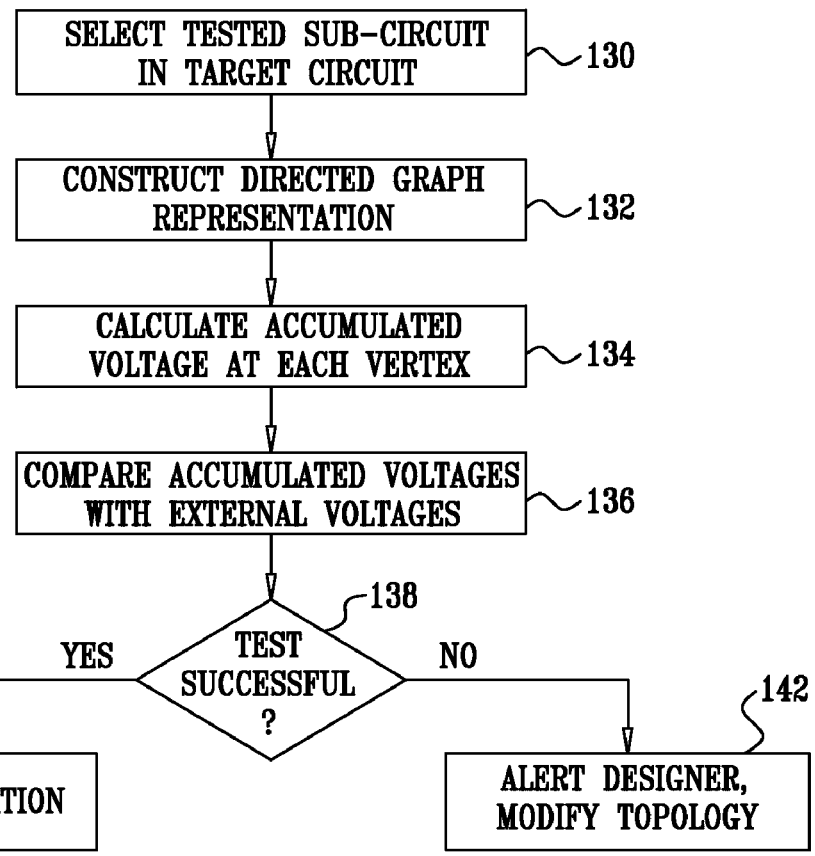
FIG. 6 is a flow chart that schematically illustrates a method for topology testing, in accordance with an embodiment of the present invention.

FIG. 6 is a flow chart that schematically illustrates an automatic method for detecting and alerting the designer when the sub-threshold condition described above occurs, in accordance with an embodiment of the present invention.

The method begins with the designer selecting a sub-circuit of target circuit 38 whose topology is to be tested, in a sub-circuit selection step 130. The selected sub-circuit may comprise any part of the target circuit, and even the entire circuit. In some embodiments, processor 40 may always choose to test the entire target circuit. In such cases, step 130 is omitted.

Processor 40 represents the tested sub-circuit as a directed graph, in a graph representation step 132. Circuit nodes are represented as vertices and interconnections between nodes are represented as directed edges. Each vertex of the graph is assigned the voltage of the corresponding node in target circuit 38. Graph edges are directed from the vertex having the lower voltage to the vertex having the higher voltage. All supply and reference voltages at the appropriate vertices are set to their target circuit values.

For each gate-to-source voltage $V_{gs}$ in the tested sub-circuit, a minimum allowable voltage value is determined. In some embodiments, the minimum allowable value is set to the threshold voltage of the transistor in question. Alternatively, if the designer specifies that a certain sub-threshold voltage range is permissible, the minimum allowable value is set to be slightly smaller than the threshold voltage. The minimum allowable values are assigned as voltage drops between the gate and source of the relevant transistor. These voltage drops are assigned to the respective graph edges of the directed graph. Voltage drops at all other graph edges are set to zero.

After constructing the directed graph, processor 40 traverses the graph and calculates accumulated voltages at the graph vertices, at a voltage accumulation step 134. In the description that follows, processor 40 traverses the graph starting from lower voltage vertices and progressing to higher voltage vertices. Alternatively, the method can be implemented, mutatis mutandis, with processor 40 traversing the graph from high voltage vertices to lower voltage vertices. The graph can be traversed using any suitable graph traversal strategy known in the art, such as a breadth-first search strategy.

When traversing each graph edge, processor 40 calculates for the vertex at the far end of the currently-traversed edge a maximum value of accumulated voltages denoted $V_{vertex}$, defined as:

$$V_{vertex}=\max\{V_{vertex}, V_{vertex'}+\Delta V_{edge}\} \quad [11]$$

wherein the newly calculated $V_{vertex}$ denotes the accumulated voltage at the current vertex (i.e., at the end of the currently-traversed edge), $V_{vertex'}$ denotes the accumulated voltage at the beginning of the edge, $\Delta V_{edge}$ denotes the voltage drop across the currently-traversed edge. $\Delta V_{edge}$ can either take the value of the minimum gate voltage, if the edge corresponds to a source-gate connection, or be equal to zero.

The initial values of vertex voltages are either equal to the external voltages applied to the corresponding target circuit nodes, or zero if there are no external voltages applied. In general, vertices may be visited more than once by the traversal process. Graph traversal terminates when processor 40 visits all edges and vertices of the directed graph.

Processor 40 now compares the maximum accumulated voltage of each vertex with the external voltage applied to this vertex, if such external voltage exists, at a voltage comparison step 136. This comparison is performed for all vertices in the tested sub-circuit. If all accumulated voltages are equal to the corresponding external voltages, processor 40 declares the test successful. Otherwise, if at least one of the accumulated voltages is larger than the external voltage, the test fails.

The voltage accumulation process described above can be viewed as an accumulation of the minimal threshold voltages along a certain path in the schematic design of target circuit 38. The accumulated result is compared to the potential differences that are sustained by the external voltages. If the sum of minimal threshold voltages is larger than this potential difference, at least one transistor operates in a sub-threshold region, therefore the test fails.

Processor 40 checks whether the test is successful, at a success checking step 138. If successful, the processor can continue the migration process, at a continued migration step 140. Otherwise, the migration processor alerts the designer, at an alerting step 142. The migration processor typically indicates to the designer that the tested sub-system cannot be migrated using the original topology of the source circuit, and that a topology modification is desired.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method for migrating an electronic circuit from a source technology to a target technology, the method comprising:
   accepting in a computer a source circuit that operates in the source technology, the source circuit comprising source components interconnected at nodes in accordance with a source topology;
   determining source voltages at the nodes of the source circuit;
   transforming the source voltages at the nodes of the source circuit to produce respective target voltages suitable for corresponding nodes of a target circuit in accordance with the target technology;
   separating the source circuit into sub-circuits, which are interconnected at the nodes, each sub-circuit comprising one or more of the source components;
   individually in each separated sub-circuit, converting the one or more of the source components to one or more respective target components in the target technology subject to a constraint that the respective target voltages at the corresponding nodes interconnecting each sub-circuit serve as biasing voltages of the one or more target components in that sub-circuit, thereby producing migrated sub-circuits; and
   reconnecting the migrated sub-circuits to produce the target circuit in the target technology, the target circuit having a target topology identical to the source topology, while preserving the biasing voltages at the nodes interconnecting the migrated sub-circuits, whereby performance of the target components is unaffected by reconnection of the sub-circuits.

2. The method according to claim 1, wherein the converting the one or more of the source components comprises determining geometrical properties of the one or more of the source components responsively to the target voltages.

3. The method according to claim 1, wherein the converting the one or more of the source components comprises identifying whether the one or more of the source components belong to a specialized component type comprising at least one of switching components, digital components and matched components, and applying a dedicated conversion process to the specialized component type.

4. The method according to claim 3, wherein the identifying whether the one or more of the source components belong to the specialized component type comprises at least one of detecting an operational condition typical of switching components and accepting an indication from a designer identifying at least some of the matched components, the switching components and the digital components.

5. The method according to claim 3, wherein the applying the dedicated conversion process comprises at least one of setting a bias operating point suitable for the switching components, and migrating a led component of the matched components responsively to a conversion of a leading component selected from the matched components.

6. The method according to claim 1, wherein, for some of the source voltages, the transforming the source voltages comprises iteratively searching for optimal values of the respective target voltages.

7. The method according to claim 1, wherein the converting the one or more of the source components comprises defining control parameters specifying performance-related constraints for converting the one or more of the source components, and determining geometrical properties of the respective one or more target components responsively to the control parameters.

8. The method according to claim 7, wherein the defining the control parameters comprises defining scaling factors between electrical properties of the one or more of the source components and the one or more respective target components, the scaling factors comprising a voltage scaling factor, a current scaling factor and an additional control parameter.

9. The method according to claim 8, wherein the additional control parameter comprises one of a channel length scaling factor, an effective channel length scaling factor, an input capacitance scaling factor, an effective transconductance scaling factor and an output conductance scaling factor.

10. The method according to claim 7, wherein the determining geometrical properties comprises determining at least one of a geometrical length and a width of the one or more target components.

11. The method according to claim 7, further comprising, after reconnecting the migrated sub-circuits, verifying a performance of the target circuit and improving the performance by modifying at least one of the control parameters of at least one source component and reconverting the at least one source component responsively to the modified at least one of the control parameters.

12. The method according to claim 1, wherein the source circuit has a source performance figure-of-merit, and wherein the converting the one or more of the source components comprises modifying the target circuit to have a corresponding target performance figure-of-merit, different from the source performance figure-of-merit.

13. The method according to claim 1, further comprising automatically replacing source technology schematic symbol representations of at least some the source components with respective target technology schematic symbol representations of at least some of the target components.

14. An apparatus for migrating an electronic circuit from a source technology to a target technology, the apparatus comprising:
   an input interface, which is arranged to accept a source circuit in the source technology, the source circuit comprising source components interconnected at nodes in accordance with a source topology; and
   a migration processor, which is arranged to determine source voltages at the nodes of the source circuit, to transform the determined source voltages at the nodes of the source circuit to produce respective target voltages suitable for corresponding nodes of a target circuit in accordance with the target technology, to separate the source circuit into sub-circuits, which are interconnected at the nodes, each sub-circuit comprising one or more of the source components, to individually convert in each separated sub-circuit the one or more of the source components to one or more respective target components in the target technology subject to a constraint that the respective target voltages at the corresponding nodes interconnecting each sub-circuit serve as biasing voltages of the one or more target components in that sub-circuit, thereby producing migrated sub-circuits, and to reconnect migrated sub-circuits to produce the target circuit in the target technology, the target circuit having a target topology identical to the source topology, while preserving the biasing voltages at the nodes interconnecting the migrated sub-circuits, whereby performance of the target components is unaffected by reconnection of the sub-circuits.

15. The apparatus according to claim 14, wherein the migration processor is arranged to determine geometrical properties of the one or more of the source components responsively to the target voltages.

16. The apparatus according to claim 14, wherein the migration processor is arranged to identify whether the one or more of the source components belong to a specialized component type comprising at least one of switching components, digital components and matched components, and to apply a dedicated conversion process to the specialized component type.

17. The apparatus according to claim 16, wherein the migration processor is arranged to identify whether the one or more of the source components belong to the specialized component type by performing at least one of detecting an operational condition typical of the switching components and accepting an indication from a designer identifying at least some of the switching components, the digital components and the matched components.

18. The apparatus according to claim 16, wherein the migration processor is arranged to apply the dedicated conversion process by performing at least one of setting a bias operating point suitable for the switching components, and migrating a led component of the matched components responsively to a conversion of a leading component selected from the matched components.

19. The apparatus according to claim 14, wherein the migration processor is arranged to transform some of the source voltages by iteratively searching for optimal values of the respective target voltages.

20. The apparatus according to claim 14, wherein the migration processor is arranged to accept definitions of control parameters specifying performance related constraints for converting the one or more of the source components and to determine geometrical properties of the respective one or more target components responsively to the control parameters.

21. The apparatus according to claim 20, wherein the control parameters comprise scaling factors between electrical properties of the one or more of the source components and the one or more respective target components, the scaling factors comprising a voltage scaling factor, a current scaling factor and an additional control parameter.

22. The apparatus according to claim 21, wherein the additional control parameter comprises one of a channel length scaling factor, an effective channel length scaling factor, an input capacitance scaling factor, an effective transconductance scaling factor and an output conductance scaling factor.

23. The apparatus according to claim 20, wherein the migration processor is arranged to determine at least one of a geometrical length and a width of the one or more target components.

24. The apparatus according to claim 20, wherein the migration processor is arranged to verify, after reconnecting the migrated sub-circuits, a performance of the target circuit and to improve the performance by modifying at least one of the control parameters of at least one source component and re-converting the at least one source component responsively to the modified at least one of the control parameters.

25. The apparatus according to claim 14, wherein the source circuit has a source performance figure-of-merit, and wherein the migration processor is arranged to enable a designer to modify the target circuit to have a corresponding target performance figure-of-merit different from the source performance figure-of-merit.

26. The apparatus according to claim 14, wherein the migration processor is arranged to automatically replace source technology schematic symbol representations of at least some the source components with respective target technology schematic symbol representations of at least some of the target components.

27. A computer software product for migrating an electronic circuit from a source technology to a target technology, the product comprising a computer-readable medium, in which program instructions are stored, the program instructions, when read by a computer, cause the computer to accept a source circuit in the source technology, the source circuit comprising source components interconnected at nodes in accordance with a source topology, to determine source voltages at the nodes of the source circuit, to transform the determined source voltages at the nodes of the source circuit to produce respective target voltages suitable for corresponding nodes of a target circuit in accordance with the target technology, to separate the source circuit into sub-circuits, which are interconnected at the nodes, each sub-circuit comprising one or more of the source components, to individually convert in each separated sub-circuit the one or more of the source components to one or more respective target components in the target technology subject to a constraint that the respective target voltages at the corresponding nodes interconnecting each sub-circuit serve as biasing voltages of the one or more target components in that sub-circuit, thereby producing migrated sub-circuits, and to reconnect migrated sub-circuits to produce the target circuit in the target technology, the target circuit having a target topology identical to the source topology, while preserving the biasing voltages at the nodes interconnecting the migrated sub-circuits, whereby performance of the target components is unaffected by reconnection of the sub-circuits.

28. The computer software product according to claim 27, wherein the program instructions cause the computer to determine geometrical properties of the one or more of the source components responsively to the target voltages.

29. The computer software product according to claim 27, wherein the program instructions cause the computer to identify whether the one or more of the source components belongs to a specialized component type comprising at least one of switching components, matched components and digital components, and to apply a dedicated conversion process to the specialized component type.

* * * * *